United States Patent [19]
Piesinger

[11] Patent Number: 5,870,047
[45] Date of Patent: Feb. 9, 1999

[54] SIGNAL CONVERTER USING MULTIPLE DATA STREAMS AND METHOD THEREFOR

[75] Inventor: Gregory H. Piesinger, Cave Creek, Ariz.

[73] Assignee: SiCOM, Inc., Scottsdale, Ariz.

[21] Appl. No.: 888,539

[22] Filed: Jul. 7, 1997

[51] Int. Cl.⁶ .................................................. H03M 1/66
[52] U.S. Cl. .......................................... 341/143; 375/317
[58] Field of Search .................................... 341/143, 144; 375/316, 317

[56] References Cited

U.S. PATENT DOCUMENTS

| | | | |
|---|---|---|---|
| 3,839,675 | 10/1974 | Wernikoff et al. | 325/38 |
| 3,928,809 | 12/1975 | Tschudi et al. | 328/58 |
| 4,245,345 | 1/1981 | Gitlin et al. | 375/13 |
| 5,533,073 | 7/1996 | Rriksson | 375/371 |
| 5,600,678 | 2/1997 | Petranovich et al. | 375/298 |

Primary Examiner—Howard L. Williams
Assistant Examiner—Peguy Jean Pierre
Attorney, Agent, or Firm—Meschkow & Gresham, P.L.C.; Lowell W. Gresham; Jordan M. Meschkow

[57] ABSTRACT

A signal converter (20) processes an incoming digital data stream (24) to produce an analog signal (26). A pulse shaping network (28) is configured to receive the incoming digital data stream (24) and generate a plurality of subset data streams (30). A precompensation network (32) then crosscouples the subset data streams (30) to produce cross-coupled data streams (38). Each of crosscoupled data streams (38) are then converted by respective ones of digital to analog converters (22) to produce intermediate analog signals (44). The intermediate analog signals (44) are summed by an operational amplifier (46) to produce the analog signal (26). The precompensation network (32) can be combined with the pulse shaping network (28) by using a common look-up memory element (70) to perform both functions.

24 Claims, 6 Drawing Sheets

| | | PERIOD | | | | | |
|---|---|---|---|---|---|---|---|
| | 1 | 2 | 3 | 4 | 5 | ... | K |
| $J_0$ | 2 | 5 | 3 | ... | | | |
| $J_1$ | 3 | 6 | 5 | ... | | | |
| $J_2$ | 5 | 7 | 6 | ... | | | |
| $J_3$ | 6 | 4 | 7 | ... | | | |
| $R_0$ | 0 | 6 | 4 | 7 | ... | | |
| $\Delta I_0(T)$ | | 2 | -1 | -1 | ... | | |
| $\Delta I_1(T)$ | | 1 | 1 | 2 | ... | | |
| $\Delta I_2(T)$ | | 2 | 1 | 1 | ... | | |
| $\Delta I_3(T)$ | | 1 | -3 | 1 | ... | | |
| $R_0(T)$ | | 0 | 2 | 1 | ... | | |
| $R_1(T)$ | | 0 | 1 | 2 | ... | | |
| $R_2(T)$ | | 0 | 2 | 3 | ... | | |
| $R_3(T)$ | | 0 | 1 | -2 | ... | | |
| $I_{OUT_0}(T)$ | | 2 | 1 | 0 | ... | | |
| $I_{OUT_1}(T)$ | | 1 | 2 | 4 | ... | | |
| $I_{OUT_2}(T)$ | | 2 | 3 | 4 | ... | | |
| $I_{OUT_3}(T)$ | | 1 | -2 | -1 | ... | | |
| $dI_{OUT_0}(T)$ | | 2 | 1 | 0 | ... | | |
| $dI_{OUT_1}(T)$ | | | 1 | 2 | 4 | ... | |
| $dI_{OUT_2}(T)$ | | | 2 | 3 | 4 | ... | |
| $dI_{OUT_3}(T)$ | | | 1 | -2 | -1 | ... | |
| ANALOG SIGNAL | | 2 3 5 6 | 5 6 7 4 | 3 5 6 7 | ... | | |

SIGNAL CONVERTER USING MULTIPLE DATA STREAMS AND METHOD THEREFOR

TECHNICAL FIELD OF THE INVENTION

The present invention relates generally to digital to analog signal converters which are useful in data communication modulators.

BACKGROUND OF THE INVENTION

Modulation is the process of varying a carrier signal according to the pattern provided by another signal. In the field of data communications, modulators convert digital signals into analog signals suitable for transmission by using the digital signal as a pattern that determines the wave shape that the analog signal (i.e. the carrier signal) will have.

Pulse shaping networks have been used in modulators to convert an incoming digital data stream into a plurality of in-phase data streams and a plurality of quadrature-phase data streams. FIG. 1 shows an exemplary prior art modulator that includes a pulse shaping network. In this prior art example, the pulse shaping network is implemented in a single CMOS application specific integrated circuit (ASIC) and produces four in-phase data streams and four quadrature-phase data streams. Each of these data streams is formed by a string of ten bit digital samples that are output at a baud rate that may be as high as 68 megabaud. The digital samples of the in-phase data streams are then input into a multiplexer which operates at a rate equal to the number of digital samples per symbol times the baud rate and sequentially routes the samples into a digital to analog converter (DAC) to produce an I channel analog output. Likewise, a similar circuit produces the Q channel output.

However, this prior art implementation is undesirable because the multiplexer and DAC must operate at a rate substantially higher than the baud rate (i.e. up to 272 megabaud). The prior art solution implements the multiplexer and DAC in emitter coupled logic (ECL) or a similar technology to accommodate this higher operating rate. However, although ECL components are fast, they are also power hungry and expensive parts. Unfortunately, this approach is undesirable in systems which are battery powered and/or operate in space because these types of components typically consume significantly more power.

Another undesirable aspect of this prior art modulator is that the pulse shaping network produces a number of output samples per symbol each having a ten bit resolution. As a result, the digital to analog converts must have at least a ten bit resolution. The higher bit resolution of the DACs results in a slower processing time unless higher speed, more costly DACs are utilized. Additionally, another problem exists in this prior art solution in that there are eight of these ten bit output samples per symbol. Eighty pins are needed for their outputs alone, resulting in a complex ASIC package for the pulse shaping network.

There is a continual need for developing ways to decrease the size of equipment without decreasing capability. This need for smaller equipment and associated components arises from applications where portability is required, where there may be limited space for equipment, and/or where cost is an important factor. An efficient approach for implementing a modulator system in a limited space is to incorporate a pulse shaping network and DACs in a common ASIC. This approach would have an additional benefit in that by incorporating the system on a common semiconductor substrate, the DACs would be very well matched. Well matched circuitry may prevent differential temperature drift problems. Unfortunately, the prior art modulator cannot accommodate this efficiency because the high precision, high speed DACs are incompatible with the ASIC technology.

SUMMARY OF THE INVENTION

Accordingly is an advantage of the present invention to provide a signal converter and a method for efficiently processing an incoming digital data stream into an analog signal.

Another advantage of this invention is the implementation of a low power signal converter architecture.

Another advantage of this invention is the incorporation of a plurality of less costly digital to analog converters that operate at lower bit resolutions.

Another advantage of this invention is the implementation of an architecture that can be incorporated onto a common application specific integrated circuit.

The above and other advantages of the present invention are carried out in one form by a signal converter that processes an incoming digital data stream into an analog signal. The signal converter includes a circuit for generating a plurality of subset data streams from the incoming digital data stream. A precompensation network then crosscouples the subset data streams to produce a plurality of cross-coupled data streams. The signal converter also includes a plurality of digital to analog converters that are responsive to respective ones of the crosscoupled data streams. An analog summing circuit is coupled to each of the digital to analog converters and produces the analog signal.

In another form, the present invention provides a method of operating a digital communication modulator to provide a modulated analog signal. The method calls for receiving an incoming digital data stream extending over a plurality of symbols. Intra-symbol samples are then produced in response to the incoming digital data stream. The intra-symbol samples are converted into a corresponding plurality of intermediate analog signals by a plurality of digital to analog converters. The intermediate analog signals are then combined to produce the modulated analog signal.

BRIEF DESCRIPTION OF THE DRAWINGS

A more complete understanding of the present invention may be derived by referring to the detailed description and claims when considered in connection with the Figures, wherein like reference numbers refer to similar items throughout the Figures, and:

FIG. 4 shows a timing diagram for an incoming digital data stream being processed through the signal converter of FIG. 2;

DETAILED DESCRIPTION OF THE PREFERRED EMBODIMENTS

Figure 2:
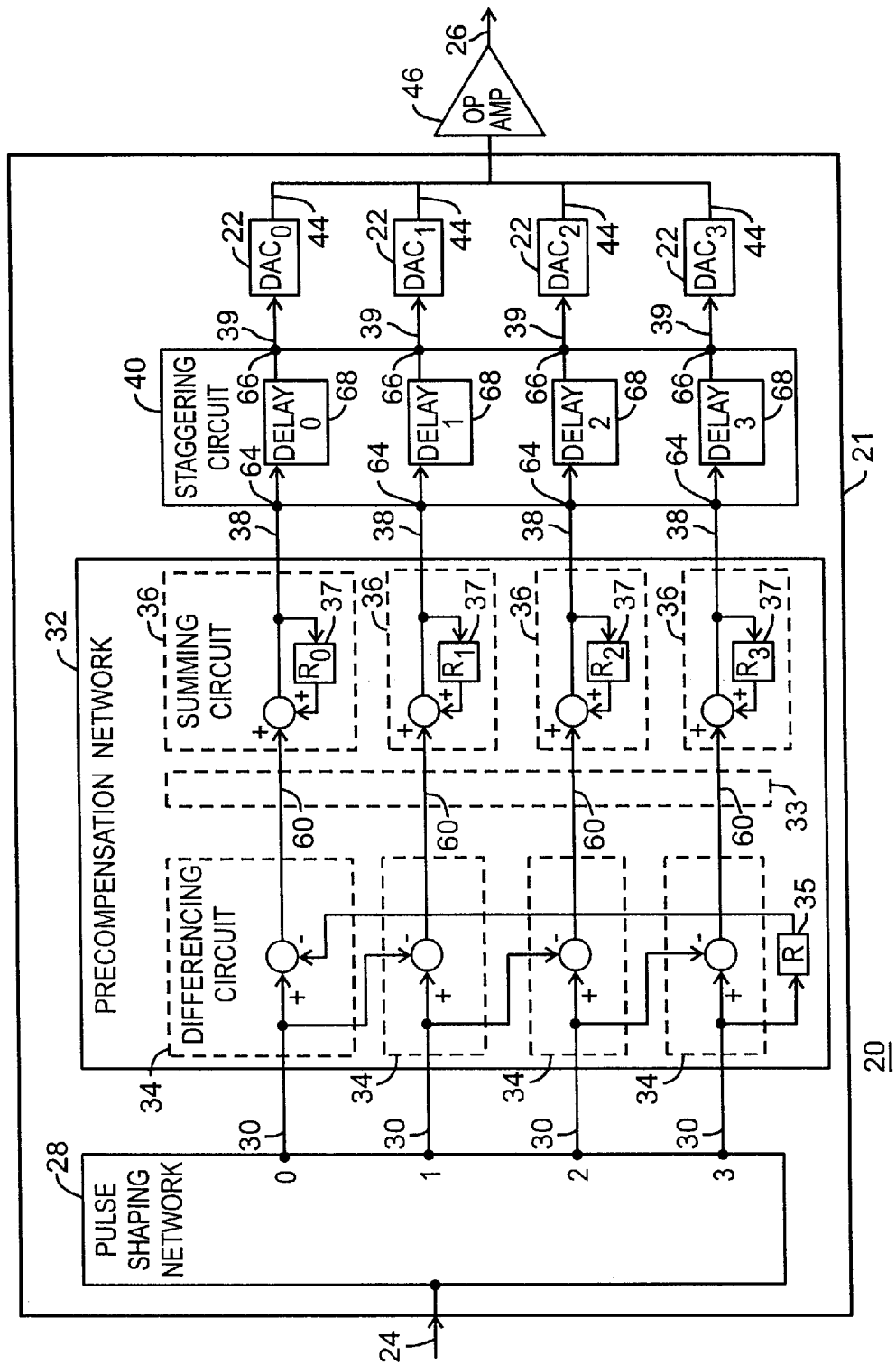
FIG. 2 shows a block diagram of a signal converter that employs a plurality of digital to analog converters implemented on a common semiconductor substrate.

FIG. 2 shows a block diagram of a signal converter 20 that employs a plurality of digital to analog converters (DACs)

22 implemented on a common semiconductor substrate 21. In the preferred embodiment of the present invention, signal converter 20 is a digital communications modulator for which most components are configured on an application specific integrated circuit (ASIC) utilizing low power complementary metal oxide semiconductor (CMOS) technology. To minimize power consumption and to simplify circuitry, DACs 22 operate in parallel to process a plurality of subset data streams (discussed below) in an incoming digital data stream 24. Additionally, potential differential temperature problems between DACs 22 are prevented by incorporating the circuitry on substrate 21.

Signal converter 20 processes an incoming digital data stream 24 and produces an analog signal 26. Incoming digital data stream 24 may be either real or complex. With respect to the following description, incoming samples (discussed below) of incoming digital data stream 24 may be either single data samples in a real digital data stream, or complex (I or Q) data samples of a complex data stream. For a complex incoming digital data stream, signal converter 20 may then produce analog signal 26 that is either the I channel analog output or the Q channel analog output. The other of the I and Q channels may also be implemented in substrate 21.

Incoming digital data stream 24 is received by pulse shaping network 28. Pulse shaping network 28 is responsive to incoming digital data stream 24 for generating a plurality of subset data streams 30. In the preferred embodiment, pulse shaping network 28 may incorporate the use of four finite impulse response (FIR) filters to generate four pulse shaping subset samples (discussed below) per symbol to form respective ones of subset data streams 30. These subset samples are each ten bit digital numbers that are output at a baud rate that may be as high as 68 megabaud.

Outputs of pulse shaping network 28 are coupled to inputs of a precompensation network 32. Subset data streams 30 are output from pulse shaping network 28 and input into precompensation network 32. Precompensation network 32 includes a plurality of differencing circuits 34, a pipelining element 33, and a plurality of summing circuits 36.

In the preferred embodiment illustrated in FIG. 2, precompensation network 32 includes four differencing circuits 34 with inputs coupled to the outputs of pulse shaping network 28. Additionally, one storage register 35 is coupled to the fourth one of differencing circuits 34. Pipelining element 33 is coupled to outputs of differencing circuits 34 and represents a register clocked at the baud rate. Coupled to outputs to pipelining element 33 are inputs to a total of four summing circuits 36. Each of summing circuits 36 is associated with a respective one of storage registers 37. This configuration results in each of differencing circuits 34 and summing circuits 36 being combined serially in pairs (i.e. one differencing circuit 34 and one summing circuit 36 per pair) for processing respective ones of subset data streams 30 to produce crosscoupled data streams 38.

Those skilled in the art will recognize that the present invention may not be limited to a pulse shaping network that produces four pulse shaping subset samples per symbol. The quantity, N, of subset samples may be higher, in which case there will be a corresponding quantity N of subset data streams 30 to be processed through respective ones of N differencing circuits 34, N summing circuits 36, and N DACs 22.

Crosscoupled data streams 38 are output from precompensation network 32 and input into staggering circuit 40. Staggering circuit 40 produces crosscoupled data streams 39 that have been temporally staggered relative to one another. Crosscoupled data streams 39 are input into DACs 22. DACs 22, responsive to respective ones of crosscoupled data streams 39, produce intermediate analog signals 44. Intermediate analog signals 44 are then summed in a high speed operational amplifier 46 to produce analog signal 26.

Figure 3:
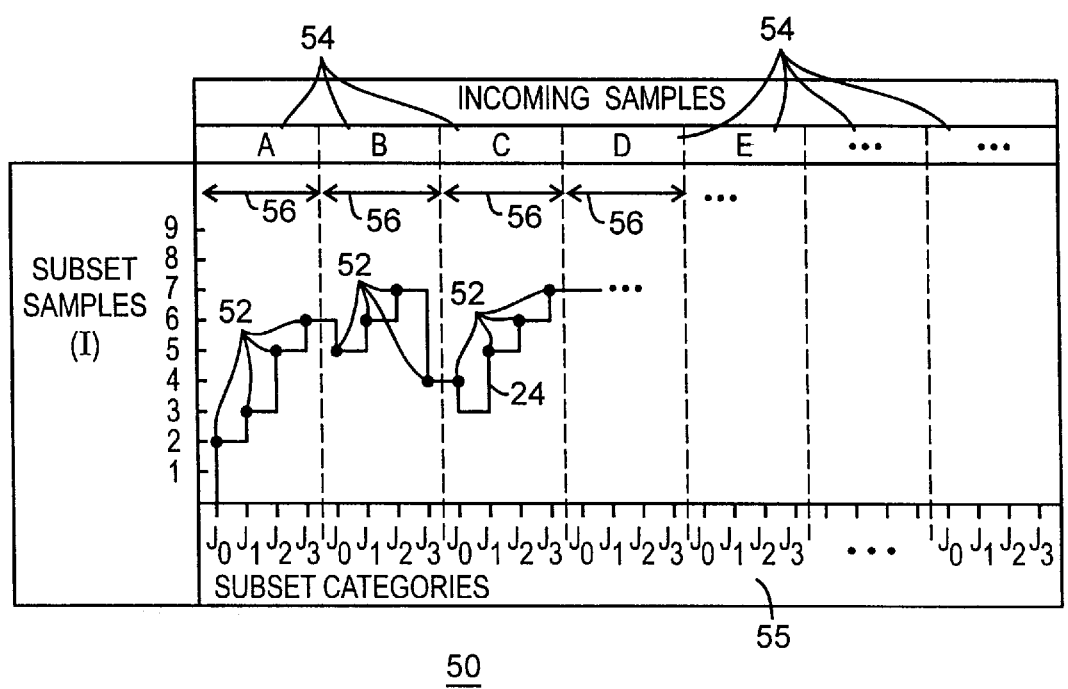
FIG. 3 shows a timing chart of an incoming digital data stream and the resulting subset samples.

To further the understanding of the present invention, the operations of signal converter 20 will be discussed in conjunction with FIGS. 3–4 using exemplary values for incoming digital data stream 24. FIG. 3 shows a timing chart 50 of incoming digital data stream 24 and the resulting subset samples 52 generated by pulse shaping network 28 (FIG. 2). FIG. 4 shows a timing diagram 53 for incoming digital data stream 24 being processed through signal converter 20.

Referring to timing chart 50 (FIG. 3), incoming digital data stream 24 is received over a plurality of symbols. Incoming digital data stream 24 exhibits a symbol rate and incoming samples 54 are digital symbols being provided at the symbol rate. The reciprocal of the symbol rate is the symbol period 56. Pulse shaping network 28 (FIG. 2) generates four subset samples 52, shown in subset categories $J_0$, $J_1$, $J_2$, and $J_3$ 55 for each of the incoming samples 54 during each symbol period 56. All samples for a given period 56 are available to precompensation network 32 at the beginning of that period 56. In the preferred embodiment, subset samples 52 are intra-symbol samples that are configured in accordance with a temporal sequence representative of incoming digital data stream 24.

Referring to timing diagram 53 (FIG. 4), pulse shaping network 28 generates four subset data streams 30 (FIG. 2) each at the symbol rate. Each of subset data streams 30, shown in subset categories $J_0$, $J_1$, $J_2$, and $J_3$ 55, receives every fourth one of subset samples 52 (FIG. 3). The first four subset samples 52 are generated during a first symbol period 56', the second four subset samples 52 are generated during a second symbol period 56", and so forth.

Each of subset samples 52 are processed in parallel by respective ones of differencing circuits 34 (FIG. 2) in the symbol period 56 immediately after being generated by pulse shaping network 28 (FIG. 2). An equation describing the operation of each of differencing circuits 34 (FIG. 2) is as follows:

$$\Delta I_{J(T)} = I_{J(T)} - I_{J-1(T)} \tag{1a}$$

or $$\Delta Q_{J(T)} = Q_{J(T)} - Q_{J-1(T)} \tag{1b}$$

where I indicates a subset sample 52 that is an in-phase sample and Q indicates a subset sample 52 that is a quadrature phase sample. Furthermore, J indicates one of subset categories $J_0$, $J_1$, $J_2$, and $J_3$ 55, J−1 refers to the previous subset category 55, and T indicates a specific symbol period 56. Upon initialization of signal converter 20 (FIG. 2), as in during power up, the value of storage register 35 is set to zero. Equations (1a) and (1b) indicate a change from a previous state. For $J_0$, the values $I_{J-1}$ or $Q_{J-1}$ are supplied from storage register 35.

Since the mathematical operation is the same, for ease of understanding the discussion will concentrate on equation (1a), however one can readily adapt the following discussion to equation (1b). Equation (1a) finds the difference between a first one of subset data samples 52 from a first one of subset data streams 30 and a previous one of subset data samples 52 from a previous one of subset data streams 30.

Differenced data streams 60 are produced for respective ones of subset data streams 30. As stated previously, the first four subset samples 52 are generated during first symbol period 56'. During second symbol period 56", differencing circuits 34 perform the calculations shown in equation (1a). Assuming for the sake of discussion that storage register 35 contains zero during first symbol period 56' and $J_0$ and $J_3$ have the values shown in FIG. 4 during symbol period 56', then during second symbol period 56" equation (1a) yields the following results:

$$\Delta I_{0(2)}=2-0=2$$

$$\Delta I_{1(2)}=3-2=1$$

$$\Delta I_{2(2)}=5-3=2$$

$$\Delta I_{3(2)}=6-5=1$$

The mathematical operation of equation (1a) is continued for each of symbol periods 56 to produce differenced data streams 60 as shown in timing diagram 53. During second symbol period 56", the one of subset samples 52 corresponding to $J_3$ from first symbol period 56' is clocked into storage register 35 so that the following is produced:

$$\Delta I_{0(3)}=5-6=-1$$

Pulse shaping network 28 may be outputting subset samples 52 (FIG. 3) at 68 megabaud, so that symbol period 56 is 14.5 Ns. To accommodate this speed, precompensation network 32 includes pipelining element 33 (FIG. 2) so that the operations of differencing circuits 34 occurs in one symbol period 56 and the resulting values of differenced data streams 60 are clocked into storage registers 37 at the subsequent symbol period. To illustrate this point, the values calculated above, of $\Delta I_{0(2)}=2$, $\Delta I_{1(2)}=1$, $\Delta I_{2(2)}=2$, $\Delta I_{3(2)}=1$, are clocked into respective ones of storage registers 37 at a third symbol period 56''', assuming storage registers 37 initially store zeros.

The sample values of differenced data streams 60 are processed by respective ones of summing circuits 36 (FIG. 2) in the symbol period 56 in which the operations of differencing circuits 34 occurs. Summing circuits 36 are configured to add a first subset sample to a second subset sample. In the preferred embodiment, an equation describing the operation of each of the differencing circuits 34 is as follows:

$$Iout_{(T)}=\Delta I_{J(T)}+Iout_{(T-1)} \quad (2a)$$

or $$Iout_{(T)}=\Delta Q_{J(T)}+Qout_{(T-2)} \quad (2b)$$

where I indicates an in-phase sample and Q indicates a quadrature phase sample. Additionally, $Iout_{(T-1)}$ and $Qout_{(T-1)}$ are the output values from summing circuits 36 from a previous symbol period 56 that are stored in respective storage registers 37. Again, since the mathematical operation is the same, for ease of understanding the discussion will concentrate on equation (2a), however one can readily adapt the following discussion to equation (2b).

Crosscoupled data streams 38 are produced by summing circuits 36 for respective ones of differenced data streams 60. As stated previously, values for crosscoupled data streams 38 are produced by respective ones of summing circuits 36 (FIG. 2) in the symbol period 56 in which the operations of differencing circuits 34 occurs. Referring to timing diagram 53 (FIG. 4) values in storage registers 37 for symbol period 56" are zero for the sake of discussion, representing $Iout_{(T-1)}=0$ or no output. Therefore, at symbol period 56", $Iout_{(2)}=\Delta I_{(2)}$.

The values determined for each of crosscoupled data streams 38 at third symbol period 56''' become equivalent to the following:

$$Iout_{(3)}=\Delta I_{(3)}+R_{(3)}$$

where $R_{(3)}$ indicates the values stored in storage registers 37. Storage registers 37 are storing the output of summing circuits 36 from second symbol period 56". So, $$Iout_{0(3)}=-1+2=1$$

$$Iout_{1(3)}=1+1=2$$

$$Iout_{2(3)}=1+2=3$$

$$Iout_{3(3)}=-3+1=-2$$

Summing circuits 36 can be thought of as digital integrators. After many thousands of symbol periods 56, any small bias will integrate up to a value that can saturate or "roll over" each of storage registers 37. To prevent this, a least significant bit value may be periodically added or subtracted from the value in storage registers 37 to wash out any such bias. One technique may be to subtract one least significant bit each symbol period 56 if the register value is positive and add one least significant bit if the register value is negative. This action produces a slight modification of the output spectrum because the output sample value is not exactly as designed. However, for many applications this modification is not detrimental. Those skilled in the art will recognize that there are other approaches to solving this integration problem, the discussion of which is outside the scope of this description.

In the preferred embodiment, summing circuits 36 process differenced data streams 60 that result from respective ones of subset data streams 30 FIG. 2). However, in an alternate embodiment the mathematical operations of differencing circuits 34 (FIG. 2) may be combined with pulse shaping network 28 so that summing circuits 36 are configured to add one of subset samples 52 from a given symbol period 56 to a previous one of subset samples 52 from a previous symbol period 56.

Sample values of crosscoupled data streams 38 are highly correlated in a digital communication modulator since they represent a measure of the change from one of subset samples 52 to the next one of subset samples 52 in a sequence. Therefore, the bit width of each of the sample values of crosscoupled data streams 38 may be as low as six to eight bits as opposed to the ten bit width of subset samples 52. In other words, fewer bits of resolution are required to accurately express crosscoupled data streams 38 than are required for subset samples 52. So, downstream circuitry, namely DACs 22 (FIG. 2) may be of lower bit resolution, speeding up processing and decreasing the amount of space required on ASIC 21 (FIG. 2).

Staggering circuit 40 (FIG. 2) has inputs 64 (FIG. 2) coupled to precompensation network 32 (FIG. 2) and outputs 66 (FIG. 2) coupled to DACs 22. Respective ones of crosscoupled data streams 38 are output from precompensation network 32 and are received at respective ones of inputs 64 of staggering circuit 40.

Staggering circuit 40 includes time delay components 68 (FIG. 2) which are configured to cause crosscoupled data streams 38 to be staggered relative to one another. In the example shown in timing diagram 53 (FIG. 4) an output delay time 69 is imparted on crosscoupled data streams 38 that is substantially equal to symbol period 56 divided by four. This staggering effect is illustrated by the one quarter symbol delay between a first one of crosscoupled data streams 38', $dIout_{0(T)}$, and a second one of crosscoupled data streams 38', $dIout_{1(T)}$, and so forth.

Following the staggering operation, crosscoupled data streams 38' are input into DACs 22 (FIG. 2). Due to the mathematical operations performed in differencing circuits 34 and summing circuits 36, digital to analog converters are configured to produce intermediate analog signals 44 that are representative of a difference between a first one of subset samples 52 and a second one of subset samples 52. Additionally DACs 22 are configured to retain respective ones of intermediate analog signals throughout a duration of time corresponding to symbol period 56.

Intermediate analog signals 44 are shown in timing diagram 53 (FIG. 4) as analog representations of crosscoupled data streams 38'. As shown in timing diagram 53, intermediate analog signals 44 are output from DACs 22 through a duration of time substantially equal to symbol period 56. Summing circuits 36 of precompensation network 32 serve to eliminate each of the intermediate analog signals 44 after the duration of time defined by symbol period 56.

The timing described above serves to appropriately align intermediate analog signals 44 so that operational amplifier 46 (FIG. 2) may produce analog signal 26 in response to incoming digital data stream 24 (FIG. 2). The combining of intermediate analog signals 44 is illustrated in timing diagram 53. During the first quarter of second symbol period 56", intermediate analog signals 44 of DACs 22 can be added to produce the analog value two. For the example depicted in FIG. 4, during the second quarter of second symbol period 56", intermediate analog signals can be added to produce three, during the third quarter the sum of intermediate analog signals 44 produces five, and during the fourth quarter the sum of intermediate analog signals 44 produces six. Thus, incoming digital data stream 24 is processed by signal converter 20 (FIG. 2) to produce analog signal 26.

Figure 5:
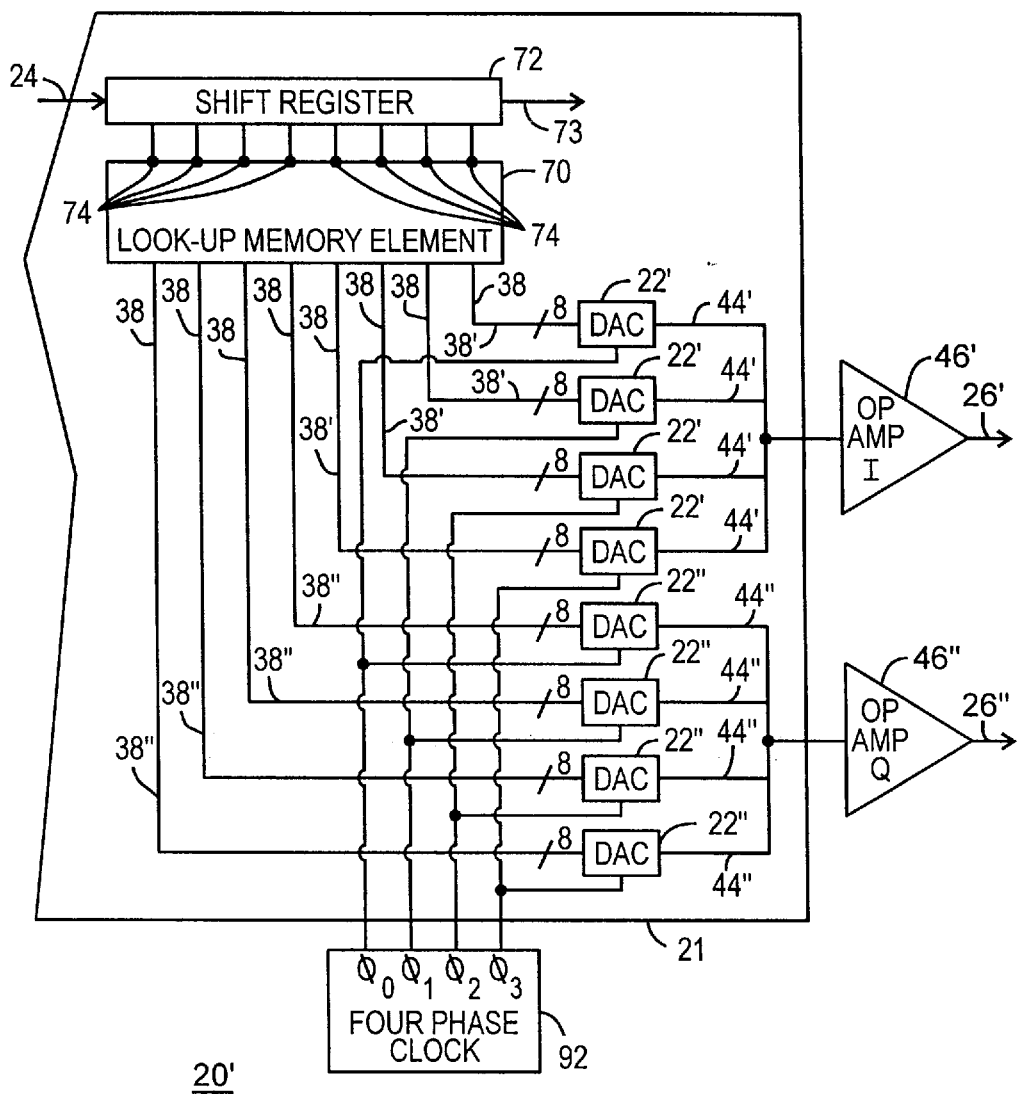
FIG. 5 shows a block diagram of the signal converter employing a look-up memory element in an alternate embodiment of the present invention.

FIG. 5 shows a block diagram of a signal converter 20' employing a look-up memory element 70 in an alternate embodiment of the present invention. Signal converter 20' is a digital communication modulator that processes incoming digital data stream 24 into modulated analog signals 26' and 26". Signal converter 20 (FIG. 2) is a "hardware" implementation of the present invention and serves to systematically illustrate the operations taking place to convert incoming digital data stream 24 into analog signal 26. By utilizing two signal converters 20 (FIG. 2) two analog signals 26 can be generated, a first analog signal 26 corresponding to analog I channel output and a second analog signal 26 corresponding to analog Q channel output. Signal converter 20' of FIG. 5 efficiently combines the operations of the "hardware" implementation of two signal converters 20 into signal converter 20'.

Signal converter 20' converts incoming digital data stream 24 into an I channel modulated analog signal 26' and a Q channel modulated analog signal 26". In this alternate embodiment, many of the operations occurring in hardware in signal converter 20 are simulated in software within look-up memory element 70 of signal converter 20'.

Incoming samples 54 (FIG. 3), or symbols, from digital data stream 24 are received in a shift register 72 at the symbol rate in accordance with a sequence defined by the data to be communicated. Parallel output from shift register 72 are received by memory element 70 at address inputs 74.

In response to address inputs 74, a look-up operation is performed at look-up memory element 70.

Figure 6:
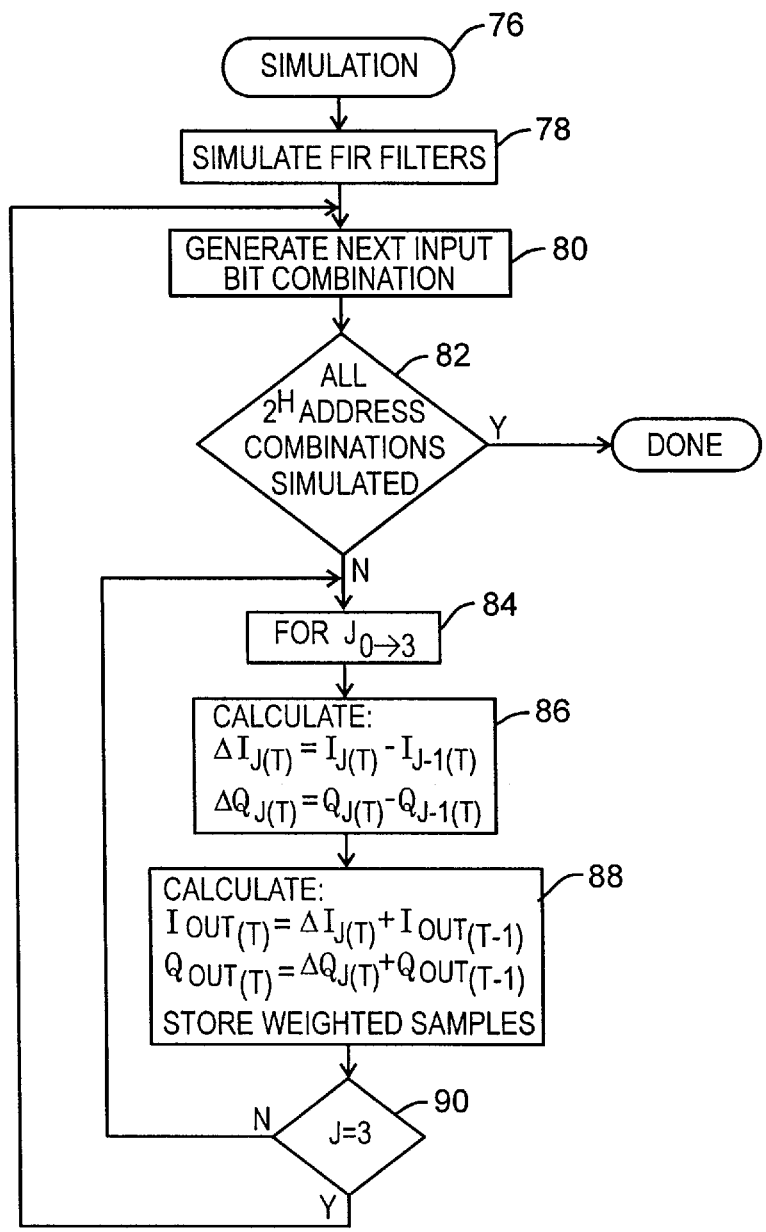
FIG. 6 shows a flowchart of a simulation process for determining samples to be stored in the look-up memory element of FIG. 5.

FIG. 6 shows a flowchart of one preferred simulation process 76 for determining samples to be stored in look-up memory element 70. Prior to configuration of signal converter 20', simulation process 76 or its equivalent is performed by a general purpose computer using a simulation program to create values for look-up memory element 70.

Figure 1:
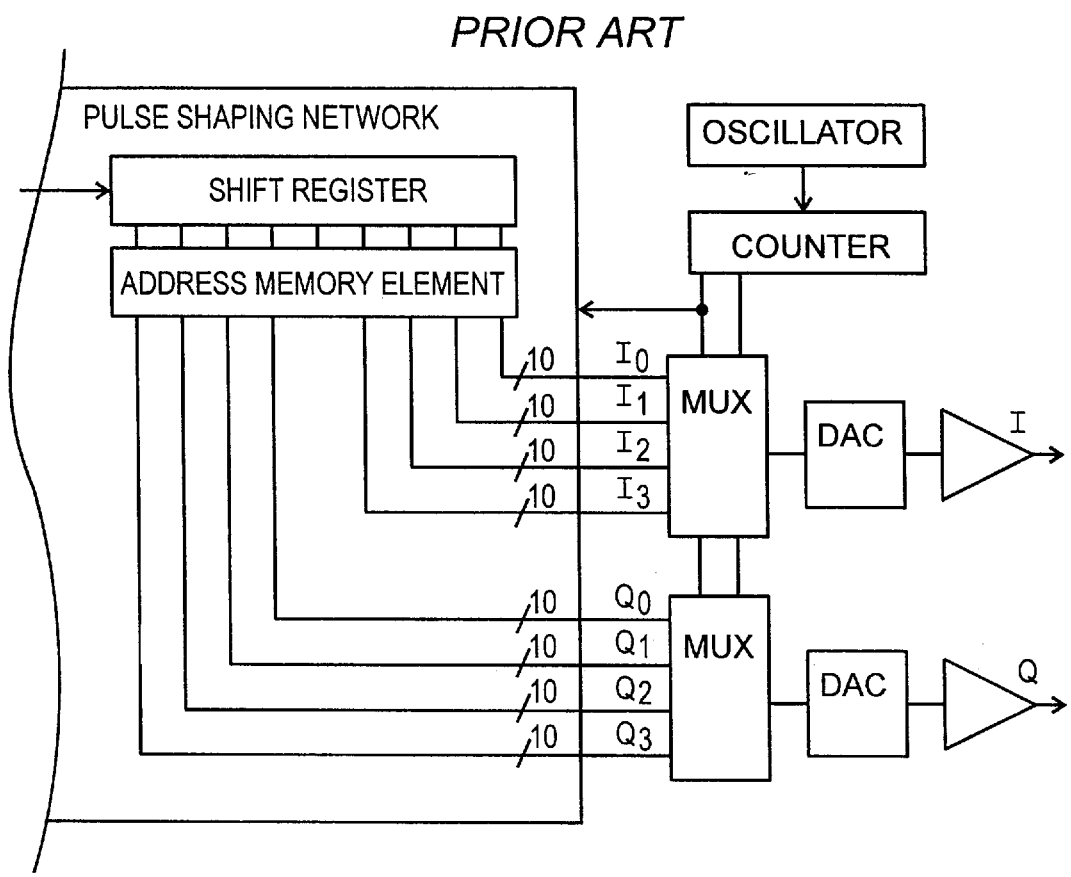
FIG. 1 shows a prior art modulator that includes a pulse shaping network.

Process 76 begins with a task 78 which simulates finite impulse response (FIR) filters to be used in the pulse shaping network of the modulator. In particular, task 78 simulates the pulse shaping network of the prior art system (FIG. 1). In simulating the pulse shaping network, task 78 simulates four FIR filters for each of I and Q output pulses. In simulating FIR filters, task 78 defines a predetermined weighting function which defines the modulation pulse shape. FIR filters and modulator pulse shaping networks are known to those skilled in the art and will not be described in detail herein.

Following task 78, a task 80 generates an input bit combination for address inputs 74 (FIG. 5). One approach for generating an input bit combination may be to utilize a pseudorandom noise generator to produce data to feed into a simulated shift register 72 (FIG. 5) used in the FIR filter simulated above in task 78.

In response to task 80, a query task 82 determines if all $2^H$ address combinations have been simulated, where H is the number of address inputs 74 of look-up memory element 70 (FIG. 5). If all of the address combinations have been simulated, then process 76 is done.

However, if query task 82 determines that all $2^H$ address combinations have not yet been simulated, process 76 proceeds to a task 84.

Task 84 is a counter that is incremented beginning at 0 and ending at 3 for each of subset samples 52 (FIG. 3) in subset categories $J_0$, $J_1$, $J_2$, and $J_3$ 55 of simulated symbol periods 56 (FIG. 3).

For $J_0$ through $J_3$, a task 86 and a task 88 are performed. Task 86 executes the differencing calculations of equations (1a) and (1b), discussed above, that are performed by differencing circuits 34 (FIG. 2) in signal converter 20 (FIG. 2).

Task 88 executes the summing calculations of equations (2a) and (2b), discussed above, that are performed by summing circuits 36 (FIG. 2) in signal converter 20 (FIG. 2). This software implementation of summing circuits 36 does not suffer from the saturation problem of storage registers 37 in the hardware implementation because incoming digital data stream 24 is eventually washed out of shift register 72, as shown at an arrow 73 (FIG. 5). The resulting value from task 88 is then saved for later storage at an address defined by the bit combination generated in task 80 in look-up memory element 70 (FIG. 5).

Following task 88, a query task 90 determines if calculations for the last one of subset samples 52 in a given symbol period 56 has been performed. When J is less than three, all subset samples 52 of symbol period 56 have not been processed, and program control loops back to task 84 to increment the subset sample counter, and perform the calculation tasks 86 and 88 for the next one of subset samples 52.

When query task 90 determines that J=3, then all subset samples 52 of one symbol period 56 have been processed, and program control loops back to task 80 to generate the next input bit combination and perform subsequent calculations until all $2^H$ address combinations have been simulated. When simulation process 76 is done, data from many iterations of task 88 is stored in look-up memory 70. The data stored in look-up memory 70 now simulates the weighting of pulse shaping network 32, the differencing of differencing circuits 34 (FIG. 2) and the summing of summing circuits 36 (FIG. 2).

Referring back to FIG. 5, in response to incoming samples 54 (FIG. 3) of incoming digital data stream 24, look-up memory element 70 generates crosscoupled data streams 38 that are intra-symbol data streams. In this embodiment of the present invention, look-up memory element 70 produces crosscoupled data streams 38' that are in-phase data streams and crosscoupled data streams 38" that are quadrature-phase data streams. As in signal conditioner 20 (FIG. 2), sample values of crosscoupled data streams 38 are highly correlated, therefore DACs 22' may only have reduced resolution when compared to corresponding prior art DACs, thus decreasing processing time and decreasing space requirements on substrate 21.

Crosscoupled data streams 38 are input into respective ones of DACs 22'. However, to produce properly aligned data to be summed, crosscoupled data streams 38 are delayed by a delay output time, φ. The delay output time, φ, is produced by a four phase clock 92 to impart a delay on crosscoupled data streams 38 of one fourth of symbol period 56 relative to one another. Those skilled in the art will recognize that the generation of delay output time, φ, may be performed in substrate 21 as opposed to the external four phase clock configuration.

Like signal converter 20, DACs 22' produce intermediate analog signals 44' for in-phase channel outputs and DACs 22" produce intermediate analog signals 44" for quadrature-phase channel outputs. Intermediate analog signals 44' are then combined by operational amplifier 46' to produce modulated analog signal 26' that is the I channel output. Likewise, intermediate analog signals 44" are then combined by operational amplifier 46" to produce modulated analog signal 26" that is the Q channel output.

In summary, signal converter 20 efficiently processes an incoming digital data stream into an analog signal. In addition, signal converter 20 is implemented using low power CMOS architecture and less costly lower bit resolution digital to analog converters. Furthermore, much of the circuitry of signal converter 20 is incorporated onto a common application specific integrated circuit in which the pin count has been decreased.

Although the preferred embodiments of the invention have been illustrated and described in detail, it will be readily apparent to those skilled in the art that various modifications may be made therein without departing from the spirit of the invention or from the scope of the appended claims. For example, the present invention may be readily adapted to pulse shaping networks that produce more than four subset samples per symbol. In such embodiments, a greater number of DACs are required, but each DAC only needs to convert lower resolution data. In yet another embodiment, a greater number of DACs may be used, and the precompensation network discussed herein, or its simulated equivalent, may be altered to operate over multiple symbols.

What is claimed is:

1. A signal converter for processing an incoming digital data stream into an analog signal, said signal converter comprising:
   means, responsive to said incoming digital data stream, for generating a plurality of subset data streams;
   a precompensation network for crosscoupling said subset data streams to produce a plurality of crosscoupled data streams;
   a plurality of digital to analog converters responsive to respective ones of said crosscoupled data streams; and
   an analog summing circuit coupled to each of said digital to analog converters for producing said analog signal.

2. A signal converter as claimed in claim 1 wherein:
   said signal converter is a modulator; and
   said generating means is a pulse shaping network for converting said incoming digital data stream into a plurality of in-phase subset data streams and a plurality of quadrature-phase subset data streams.

3. A signal converter as claimed in claim 1 wherein:
   said incoming digital data stream provides incoming samples; and
   said generating means is configured to generate a quantity N of subset samples for each of said incoming samples where N is greater than one.

4. A signal converter as claimed in claim 3 wherein said generating means is further configured so that each of said subset data streams receives every $N^{th}$ one of said subset samples.

5. A signal converter as claimed in claim 1 wherein said analog summing circuit is an operational amplifier.

6. A signal converter as claimed in claim 1 wherein:
   said generating means generates a quantity N of said subset data streams; and
   said precompensation network includes N differencing circuits coupled to said generating means, each of said differencing circuits being configured to process respective ones of said subset data streams.

7. A signal converter as claimed in claim 6 wherein:
   said generating means generates a plurality of subset samples;
   each of said subset data streams provides every $N^{th}$ one of said subset samples; and
   each of said differencing circuits is configured to receive a first one of said subset samples from a first one of said subset data streams and subtract a previous one of said subset samples from a another one of said subset data streams.

8. A signal converter as claimed in claim 1 wherein:
   said generating means generates a quantity N of said subset data streams;
   said precompensation network includes N summing circuits, wherein each of said summing circuits is configured to process a respective one of said subset data streams.

9. A signal converter as claimed in claim 8 wherein:
   said generating means generates a plurality of subset samples;
   each one of said subset data streams provides a first subset sample and a second subset sample;
   each of said summing circuits includes a storage register configured to save said first data sample; and
   each of said summing circuits is configured to add said first subset sample to said second subset sample.

10. A signal converter as claimed in claim 8 wherein said summing circuits produce respective ones of said crosscoupled data streams.

11. A signal converter as claimed in claim 1 additionally comprising a plurality of time delay components having inputs coupled to said precompensation network and having outputs coupled to respective ones of said digital to analog converters, said time delay components being configured to produce said crosscoupled data streams so that said crosscoupled data streams are temporally staggered relative to one another.

12. A signal converter as claimed in claim 11 wherein:

said incoming digital data stream exhibits a symbol period;

an output delay time is substantially equal to said symbol period divided by N;

said precompensation network produces a first one of said crosscoupled data streams and a second one of said crosscoupled data streams; and said time delay components are configured to impart said output delay time on said second crosscoupled data stream relative to said first crosscoupled data stream.

13. A signal converter as claimed in claim 1 wherein:

said generating means produces a plurality of subset samples representative of said incoming digital data stream;

each of said digital to analog converters is configured to produce an intermediate analog signal representative of a difference between a first one of said subset samples and a second one of said subset samples; and said analog summing circuit is configured to add said intermediate analog signal from each of said digital to analog converters to produce said analog signal.

14. A signal converter as claimed in claim 13 wherein:

said incoming digital data stream exhibits a symbol period; and each of said digital to analog converters is configured to retain said intermediate analog signal throughout said symbol period.

15. A signal converter as claimed in claim 1 wherein:

said generating means generates subset samples having a resolution characterized by a first number of bits; and said digital to analog converters operate at a resolution characterized by a second number of bits, said second number of bits being less than said first number of bits.

16. A signal converter as claimed in claim 1 wherein said generating means, said precompensation network, and said digital to analog converters reside on a common semiconductor substrate.

17. In a digital communication modulator, a method for providing a modulated analog signal comprising the steps of:

receiving an incoming digital data stream extending over a plurality of symbols;

producing intra-symbol samples in response to said incoming digital data stream;

converting, in a plurality of digital to analog converters, said intra-symbol samples into a corresponding plurality of intermediate analog signals; and combining said plurality of intermediate analog signals to produce said modulated analog signal.

18. A method as claimed in claim 17 wherein:

a plurality of intra-symbol samples are configured in accordance with a sequence; and said producing step comprises the step of configuring each of said intra-symbol samples to be responsive to a difference between one of said intra-symbol samples and a previous one of said intra-symbol samples in said sequence.

19. A method as claimed in claim 18 wherein said producing step additionally comprises the step of configuring each of said intra-symbol samples to be responsive to a difference between a first and a second one of said intra-symbol samples from a previous symbol.

20. A method as claimed in claim 19 wherein said producing step additionally comprises the step of configuring each of said intra-symbol samples to be responsive to a predetermined weighting function which defines a modulation pulse shape.

21. A method as claimed in claim 17 wherein:

said producing step produces a quantity N of intra-symbol samples during each symbol, where N is an integer number, to generate N intra-symbol data steams, wherein each of said intra-symbol data streams is generated at a symbol rate;

said quantity N of said digital to analog converters generate said quantity N of intermediate analog signals in response to said N intra-symbol data streams; and said N digital to analog converters perform temporally staggered conversions during each symbol.

22. A method as claimed in claim 17 wherein said producing step comprises the step of performing a look-up operation in a memory element with an address input that receives said incoming digital data stream extending over said plurality of symbols.

23. A method as claimed in claim 22 wherein:

a plurality of intra-symbol samples are configured in accordance with a sequence; and said producing step additionally comprises the step of storing, in said memory element, data configured to be responsive to a difference between each one of said intra-symbol samples and a previous one of said intra-symbol samples in said sequence, a difference between first and second ones of said intra-symbol samples from a previous symbol, and a predetermined weighting function which defines a modulation pulse shape.

24. A digital communication modulator for processing an incoming digital data stream extending over a plurality of symbols into a modulated analog signal, said modulator comprising:

a shift register responsive to said incoming digital data stream for receiving incoming samples in accordance with a sequence;

a look-up memory element configured to produce a plurality of subset data streams, each of said subset data streams being formed from an intra-symbol sample for each of said incoming samples, each of said intra-symbol samples being responsive to a difference between each one of said intra-symbol samples and a previous one of said intra-symbol samples, a difference between first and second ones of said intra-symbol samples from a previous one of said symbols, and a predetermined weighting function defining a modulation pulse shape;

a plurality of digital to analog converters responsive to respective ones of said subset data streams for producing temporally staggered intermediate analog signals; and an operational amplifier coupled to each of said digital to analog converters and configured to combine said intermediate analog signals to produce said modulated analog signal.

* * * * *